(12) United States Patent
Ferrell

(10) Patent No.: US 6,180,524 B1
(45) Date of Patent: Jan. 30, 2001

(54) METAL DEPOSIT PROCESS

(76) Inventor: Gary W. Ferrell, 608 Terrace Ave., Half Moon Bay, CA (US) 94019

(*) Notice: Under 35 U.S.C. 154(b), the term of this patent shall be extended for 0 days.

(21) Appl. No.: 09/371,296

(22) Filed: Aug. 9, 1999

(51) Int. Cl.$^7$ ............................. C25D 5/02; H05K 3/06
(52) U.S. Cl. ...................... 438/687; 438/584; 438/686; 438/687
(58) Field of Search ........................ 438/678, 686, 438/687, 584

(56) References Cited

U.S. PATENT DOCUMENTS 4,135,988 * 1/1979 Dugan et al. ..................... 204/15

* cited by examiner

Primary Examiner—Tuan H. Nguyen
Assistant Examiner—Lisa Kilday
(74) Attorney, Agent, or Firm—Timothy H. Gens; John Schipper

(57) ABSTRACT

Method and system for controllable deposit of copper onto an exposed surface of a workpiece, such as a semiconductor surface. A seed thickness of copper is optionally deposited onto the exposed surface, preferably using oxygen-free liquid ammonia to enhance this deposition. The workpiece exposed surface is then immersed in an electroplating solution, including copper and liquid ammonia at a suitable pressure and temperature, and copper is caused to plate onto the exposed surface at a controllable rate. When the copper deposited on the exposed surface reaches a selected total thickness, electroplating is discontinued, the electroplating solution is removed, and the gaseous and liquid ammonia are recovered and recycled for re-use.

17 Claims, 4 Drawing Sheets

METAL DEPOSIT PROCESS

FIELD OF THE INVENTION

This invention relates to generation and deposition of copper metal on a selected surface, such as a semiconductor substrate.

BACKGROUND OF THE INVENTION

Replacement of aluminum surfaces and contacts in a semiconductor circuit by copper surfaces and contacts is attractive, for several reasons. Copper has nearly as high a relative electrical conductivity coefficient as silver (100 versus 106) and is much higher than the corresponding coefficient for gold (65), for aluminum (59) and for any other metal. The thermal conductivity coefficient for copper is also much higher than the corresponding thermal conductivity coefficient for aluminum. Copper has a higher melt temperature than aluminum (660° C. versus 1083° C.). Copper will form an oxidized surface when exposed to oxygen but will not form some of the disagreeable surface contaminants that aluminum forms under similar conditions. Use of a metal with higher electrical conductivity will allow use of smaller driving voltages, as low as 1.8 volts, and possibly lower, which in turn will not produce as much heat to be dissipated from the chip or other semiconductor device. Use of a metal with higher electrical conductivity and higher thermal conductivity will also allow choice of a greater range of lead frame materials for use with these devices.

However, generation and controllable deposition of a copper metal of a selected small thickness on a semiconductor surface or electrical contact is problematical, in part because such copper processes have not been developed as thoroughly as the corresponding aluminum processes. Cu has a modest electrode or reducing potential at T=25° C. ($E^0$=0.32–0.34 volts), as compared to Ag, Au and Pt, for which $E^0$ is of the order or 1 volt, and Al, for which $E^0$ is about −1.7 volts. Cu has several oxidization states, as does Al.

What is needed is an approach for generation and controlled deposition of a selected thickness of copper metal on an exposed surface, such as a semiconductor material, of a workpiece, using pressures that may range from normal atmospheric pressure to several hundred psig, and using temperatures that may range from around −78° C. to around 100° C. Preferably, the approach should allow control of the rate of deposit of copper and the total thickness of copper deposited, through control of parameters such as ambient temperature, deposition time interval and electrodeposition voltage used.

SUMMARY OF THE INVENTION

These needs are met by the invention, which provides method and system for generation and controlled deposition of a selected thickness of copper metal on an exposed surface, using a fluid that includes a mixture of liquid ammonia ($NH_3$) and a copper halide ($CuCl_a$, $CuBr_b$, $CuI_c$, with a, b and c≈1–2) or a copper amine ($NCuR_1R_2$), maintained at a pressure sufficient to maintain the ammonia in liquid form. For example, at temperatures of T=−33° C. and T=20° C., the minimum pressures required to maintain ammonia in liquid form are 0 psig and 115 psig, respectively. A seed thickness of copper is first deposited on one or more exposed wafer or workpiece surfaces. Elecetroless deposition and/or electroplating of copper from a copper salt/liquid ammonia solution is then carried out to deposit the desired total thickness of copper onto the copper-seeded workpiece surface(s). The ammonia fluid (liquid and/or gas) is recovered and optionally recycled for re-use.

DESCRIPTION OF BEST MODE OF THE INVENTION

Figure 1:
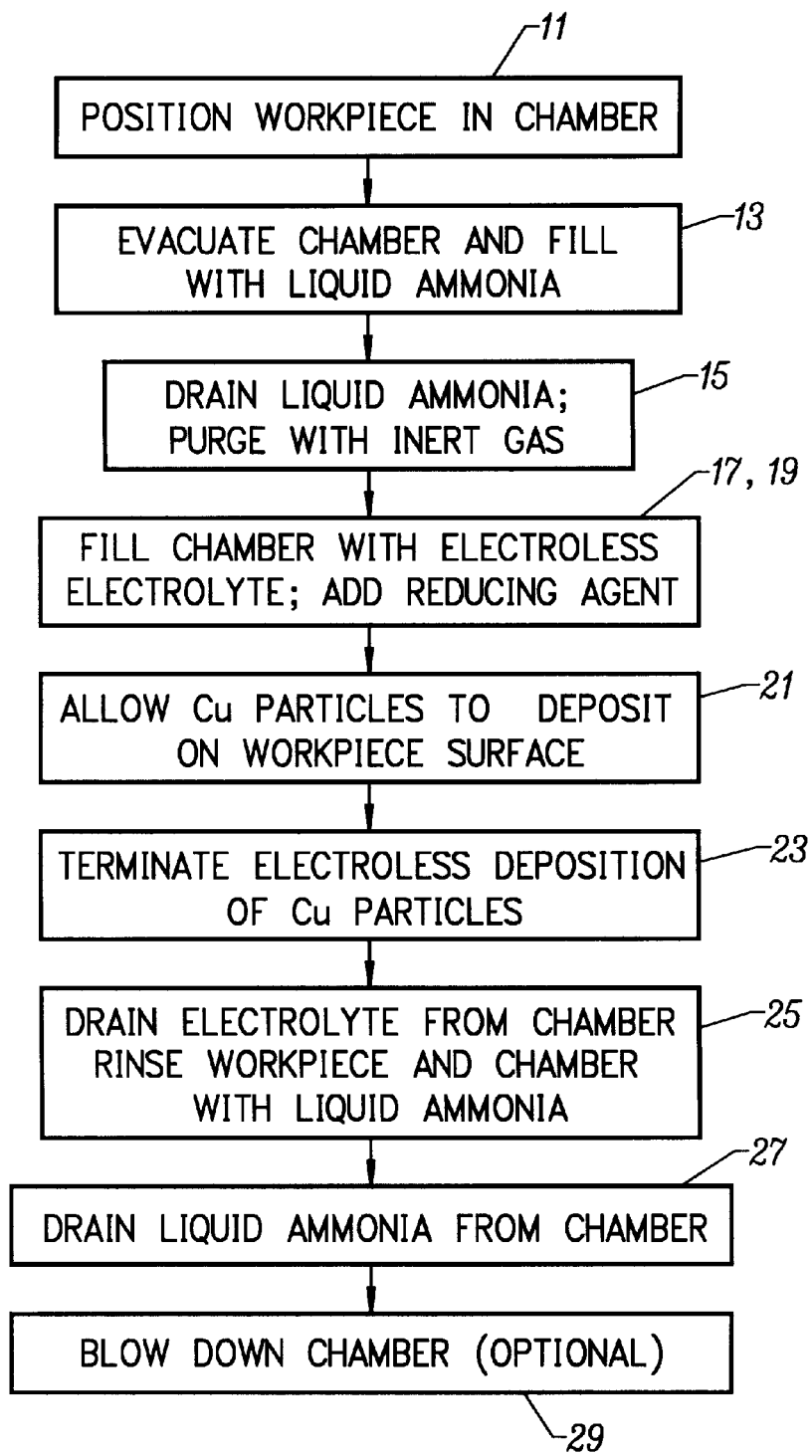
FIGS. 1, 2 and 3 are flow charts illustrating practice of the invention.

In a first alternative process, shown in a flow chart in FIG. 1, the process begins, in step 11, by positioning a workpiece, such as a wafer, on which a copper surface is to be deposited in a processing chamber. In step 13, the chamber is evacuated (preferably to a vacuum of at least $10^{-4}$ Torr) and the chamber is filled with liquid $NH_3$ at a suitable pressure and temperature. In step 15, the liquid ammonia is drained and the chamber is purged with $N_2$ or another inert gas that preferably provides no free oxygen. In step 17, the chamber is partly or wholly filled with a selected electroless electrolyte containing Cu (e.g., $CuCl_a$, $CuBr_b$ or $CuI_c$ with a, b and c≈1–2 or a copper amine $NCuR_1R_2$), and in step 19 a selected reducing agent is added to produce free electrons that combines with Cu ions to form Cu metal particles. In step 21, the Cu metal particles are allowed to come out of solution and to deposit or plate on, and preferably bind to, an exposed surface of the workpiece, in step 23. Steps 21 and/or 23 are preferably carried out at a selected temperature T1 in the range −78° C.≦T1≦90° C. The workpiece surface (s) is optionally rotated about an axis transverse to the workpiece exposed surface within the chamber, if desired, to improve uniformity of the thickness of the plated-out copper. The Cu metal is allowed to undergo electroless deposition to produce a surface of Cu metal of thickness Δh=0.1–2 μm (or higher, if desired) on the exposed surface of the workpiece.

In step 25, the electrolyte and reducing agent are drained from the chamber, and the workpiece and chamber is rinsed with liquid ammonia, to remove most or all of the remaining copper-containing electrolyte and/or organic substances and/or vapors that may be present. In step 27, the liquid ammonia is drained from the chamber and the chamber is purged with a selected inert gas. In step 29 (optional), the chamber is blown down to dry, preferably using an oxygen-free gas. In this alternative process, electroless deposition is used to deposit substantially all the Cu metal on the workpiece.

Figure 2:
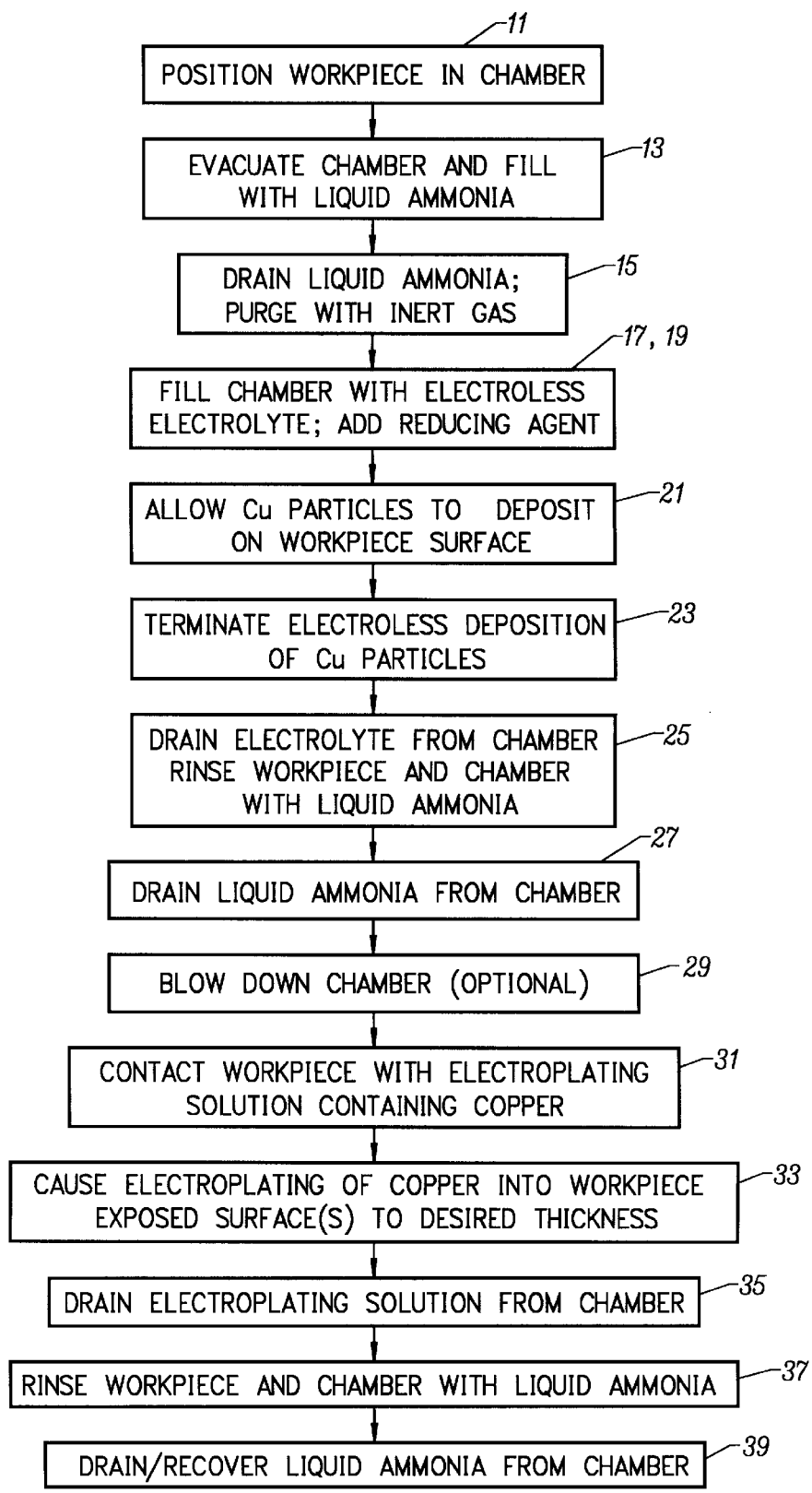

In a second alternative process, shown in FIG. 2, steps 11, 13, 15, 17, 19 and 21 are performed as in FIG. 1. In step 23', the electroless copper deposition is terminated after a selected copper thickness Δh=0.01–0.1 μm is obtained as a copper seed or substrate on the workpiece surface. Provision of a seed surface of Cu metal may be preferred, for at least two reasons: (1) the bulk electrical conductivity of the seed surface is increased to a point where electroplating can be applied, if desired, to further increase the Cu thickness of the surface; and (2) the seed surface of Cu provides a more suitable surface to which the Cu particles can subsequently bind. Steps 25, 27 and 29 are carried through as in the first alternative process.

In step 31 in the second alternative process, the workpiece in the chamber is submerged in, or contacted with, an electroplating copper solution dissolved in liquid ammonia, maintained at a selected temperature T2 in the range −78° C.≦T2≦90° C. In step 33, copper in the electroplating solution is caused to plate onto one or more exposed surfaces of the copper-seeded workpiece, using electrical contacts connected to the workpiece (cathode) and to an electrically conducting plate (anode) immersed in the electroplating solution. The electroplating voltage used for this plating step is preferably about 0.32 volts, or preferably a higher value, for copper. The total thickness of copper plated onto the workpiece surface(s) is controllable by variation of the anode-cathode voltage and by variation of the time interval for which this plating step is continued. A suitable thickness Δh of copper plated onto the workpiece surface(s) is Δh=0.1–2 μm but may be higher or lower if desired. The rate r at which copper deposition occurs will vary with the plating voltage V and with the plating temperature T3. A suitable range of plating voltage V(plate) is 0.3 volts≦V(plate)≦1 volts but may be higher if an enhanced rate of deposit is desired. The electroplating time interval length Δt may be in the range 15 sec≦Δt≦300 sec.

The remaining electroplating solution is drained from the chamber, in step 35, and the workpiece and chamber are rinsed with liquid ammonia, in step 37. Liquid ammonia and any remaining vapor are drained or otherwise removed from the second chamber and captured to recover the ammonia liquid and gas, in step 39. This process provides electroplating of Cu metal onto a "seed" surface of Cu deposited by electroless deposition.

Figure 3:
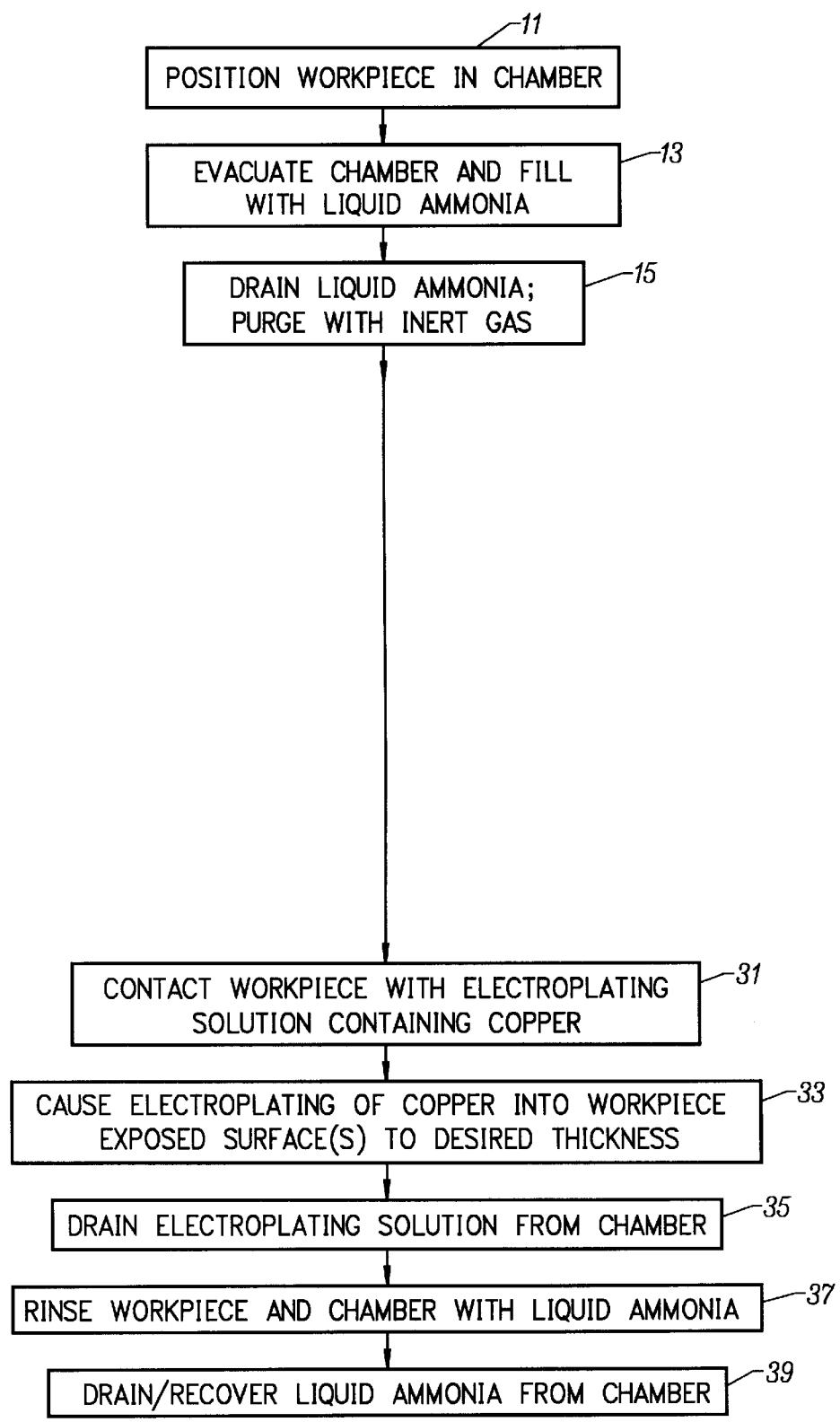

In a third alternative process, illustrated in FIG. 3, steps 11, 13, 15, 31, 33, 35, 37 and 39 are performed as in the first or second alternative process. In this third alternative process, an electroplating process is used to deposit substantially all the Cu metal onto the workpiece surface(s). This third alternative process will often require more time to complete than is required by the first or second alternative processes, for modest Cu thicknesses. If the workpiece surface is plastic or a similar polymer, initial deposit of graphite on the exposed surface may enhance Cu plate-out in an electroplating-only process.

Figure 4:
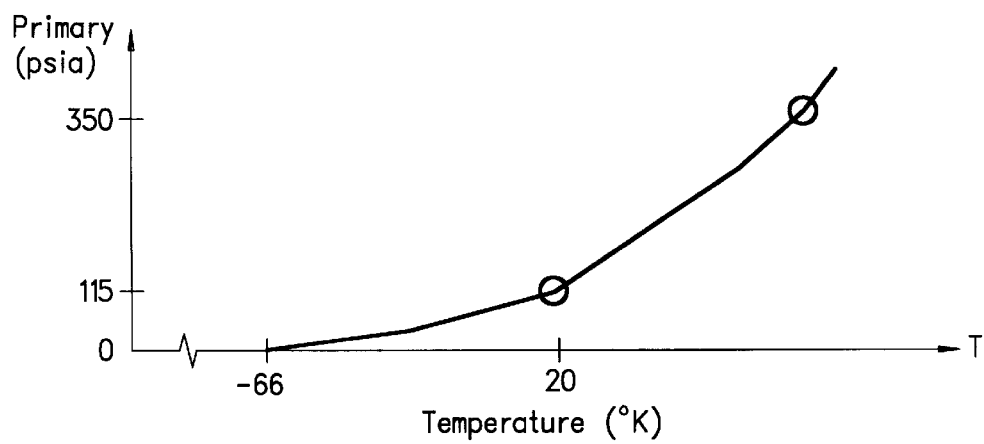
FIG. 4 is a graphical view of the approximate pressure required to maintain ammonia in liquid form, as a function of ambient temperature.

FIG. 4 is a graphical view of the approximate minimum pressure p(min) required to maintain ammonia in liquid form. The chamber pressure p required to maintain the ammonia in liquid form will depend upon, and increase with, the temperature T. For the range of temperatures T1, the pressure p will vary from about 0 psig to around 350 psig. By using a solution temperature T that is no more than about −66° C., the process steps 31, 33 and 35 may be carried out at normal atmospheric pressure or less.

The process occurs in a completely closed system, within the processing chamber, and the liquid ammonia used in the process is substantially completely recovered for reuse. The copper salts and organics removed from the chamber can be recycled or disposed of, as desired. The wafer or other workpiece remains in the chamber during the entire process so that no movement or transport of the workpiece is required here, until the copper deposit process is completed. Further, this process uses only liquid ammonia, not water, so that little or no oxygen is available to combine with the copper metal to form a weaker oxidized form of copper with smaller electrical conductivity and different material characteristics.

Figure 5:
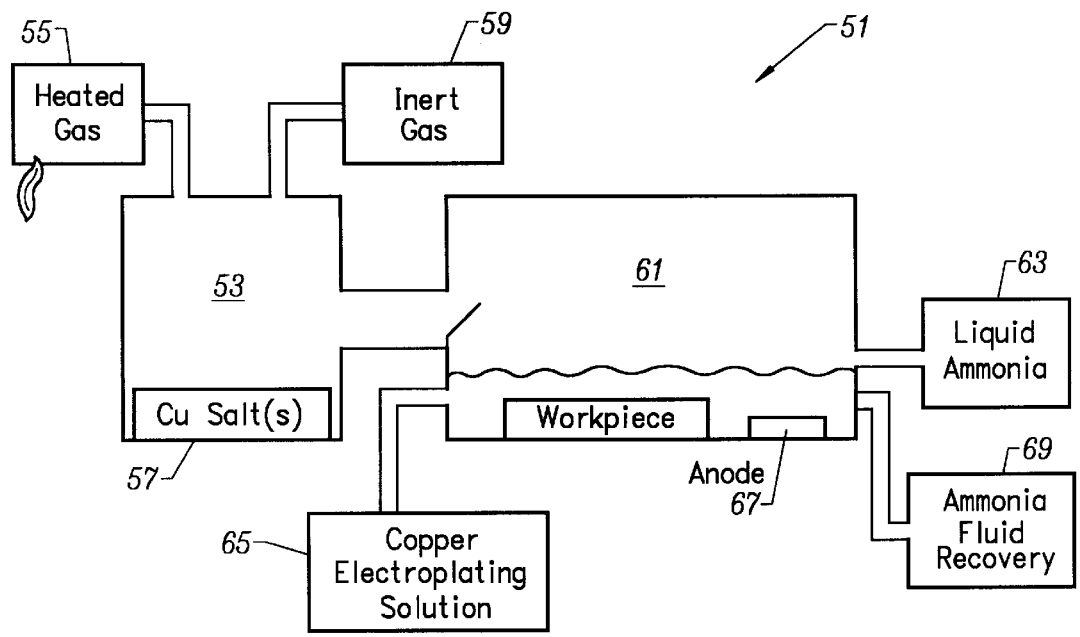
FIG. 5 is a schematic view of apparatus suitable for practice of the invention.

FIG. 5 schematically illustrates apparatus 51 suitable for practicing the invention. The apparatus includes a closed processing chamber 53, a source of Cu-containing electrolyte liquid 55 (optional), a source 57 of inert gas for chamber purging, a source 59 of liquid ammonia, a source 61 (optional) of a selected copper electroplating solution (which may be, or may not be, the same as the source 55), one or more anodes 63 (preferably copper, platinum or another metal that resists dissolving in the electroplating solution) positioned within the chamber 53. The apparatus 51 also includes an ammonia fluid recycling and recovery system 65 that receives ammonia fluid, metal salts and organics from the chamber 53 and recovers the ammonia (and, optionally, the metal electrolytes and organics).

This deposit process can be applied to deposit of other metals that are in similar positions in the periodic table, including Cu ($E^0$=0.32 volts at 25° C.), Ag ($E^0$=0.8 volts), Au, Ni, Pd, Pt, Fe ($E^0$=−0.44 volts), Co, Zn ($E^0$=−0.76 volts) and Cd ($E^0$≈0.9 volts), all with similar reactions in the presence of (liquid) ammonia. The choice of electroplating solution, and also the choice of anode, will vary with the metal selected to deposit on the workpiece exposed surface.

What is claimed is:

1. A method for controllable deposit of a metal on a surface of an object, the method comprising:

rinsing an exposed surface of a selected workpiece in a solution in an oxygen-free solution including liquid ammonia and draining the solution;

using electroless deposition to provide a seed thickness of a selected metal, of a first selected thickness no more than about 0.1 μm, on the workpiece exposed surface of a selected workpiece, where the metal is selected from a group of metals consisting of Cu, Ag, Au, Ni, Pd, Pt, Fe, Co, Zn and Cd;

contacting the workpiece exposed surface in an electroplating solution including the selected metal and liquid ammonia;

causing the selected metal in the electroplating solution to deposit on the workpiece exposed surface at a selected rate; and when a second selected thickness of the selected metal has been deposited on the workpiece exposed surface, removing the remaining electroplating solution and rinsing the workpiece exposed surface in liquid ammonia.

2. The method of claim 1, further comprising choosing Cu as said selected metal.

3. The method of claim 1, further comprising rotating said workpiece about an axis that is transverse to said workpiece surface during at least a portion of at least one of said electroless deposition process and said electroplating process.

4. The method of claim 1, further comprising choosing said workpiece to include a semiconductor material.

5. A method for controllable deposit of a metal on a surface of an object, the method comprising:

rinsing an exposed surface of a selected workpiece in a solution in an oxygen-free solution including liquid ammonia and draining the solution;

using electroless deposition to provide a thickness of a selected metal, of a first selected thickness in a range 0.1–2 μm, on the workpiece exposed surface of a selected workpiece, where the metal is selected from a group of metals consisting of Cu, Ag, Au, Ni, Pd, Pt, Fe, Co, Zn and Cd; and rinsing the workpiece exposed surface in liquid ammonia.

6. The method of claim 5, further comprising choosing Cu as said selected metal.

7. The method of claim 5, further comprising:

performing said electroless deposition process at a pressure p in a selected range 0 psig≦p≦350 psig and at a selected temperature T in the range −78° C.≦T≦90° C.

8. The method of claim 5, further comprising rotating said workpiece about an axis that is transverse to said workpiece surface during at least a portion of said electroless deposition process.

9. The method of claim 5 further comprising choosing said workpiece to include a semiconductor material.

10. A method for controllable deposit of a metal on a surface of an object, the method comprising:

rinsing an exposed surface of a selected workpiece in a solution in an oxygen-free solution including liquid ammonia and draining the solution;

contacting the workpiece exposed surface in an electroplating solution including a selected metal and liquid ammonia, where the metal is selected from a group of metals consisting of Cu, Ag, Au, Ni, Pd, Pt, Fe, Co, Zn and Cd;

causing the selected metal in the electroplating solution to deposit on the workpiece exposed surface at a selected rate; and when a selected thickness of the selected metal has been deposited on the workpiece exposed surface, removing the remaining electroplating solution and rinsing the workpiece exposed surface in liquid ammonia.

11. The method of claim 10, further comprising choosing Cu as said selected metal.

12. The method of claim 10, further comprising rotating said workpiece about an axis that is transverse to said workpiece surface during at least a portion of said electroplating process.

13. The method of claim 10, further comprising choosing said workpiece to include a semiconductor material.

14. A method for controllable deposit of a metal on a surface of an object, the method comprising:

rinsing an exposed surface of a selected workpiece in a solution in an oxygen-free solution including liquid ammonia and draining the solution;

using electroless deposition to provide a seed thickness of a selected metal, of a first selected thickness no more than about 0.1 $\mu$m, on the workpiece exposed surface of a selected workpiece, where the metal is selected from a group of metals consisting of Cu, Ag, Au, Ni, Pd, Pt, Fe, Co, Zn and Cd;

contacting the workpiece exposed surface in an electroplating solution including the selected metal and liquid ammonia;

causing the selected metal in the electroplating solution to deposit on the workpiece exposed surface, where at least one of the electroless deposition process and the electroplating deposit process is performed at a pressure p in a selected range 0 psig $\leq$ p $\leq$ 350 psig and at a selected temperature T in the range $-78°$ C.$\leq$T$\leq$90° C.;

providing an electrically conducting plate within the electroplating solution;

providing a selected voltage difference $\Delta V$ between the workpiece exposed surface and the electrically conducting plate of at least about 0.3 volts for a time interval of selected length $\Delta t$ in a range 15 sec$\leq$$\Delta t$$\leq$300 sec; and when a second selected thickness of the selected metal has been deposited on the workpiece exposed surface, removing the remaining electroplating solution and rinsing the workpiece exposed surface in liquid ammonia.

15. A method for controllable deposit of a metal on a surface of an object, the method comprising:

rinsing an exposed surface of a selected workpiece in a solution in an oxygen-free solution including liquid ammonia and draining the solution;

using electroless deposition to provide a seed thickness of a selected metal, of a first selected thickness no more than about 0.1 $\mu$m, on the workpiece exposed surface of a selected workpiece, where the metal is selected from a group of metals consisting of Cu, Ag, Au, Ni, Pd, Pt, Fe, Co, Zn and Cd, wherein the electroless deposition process of the metal on the workpiece exposed surface comprises:

contacting the workpiece exposed surface in a fluid containing at least one selected copper salt or copper amine;

allowing a portion of the copper in the copper salt or copper amine to deposit on the workpiece exposed surface;

contacting the workpiece exposed surface with copper deposited thereon in liquid ammonia, and allowing the liquid ammonia to interact with at least one of a copper salt and a selected organic substance that is present; and removing the liquid ammonia and the at least one of a copper salt and a selected organic substance that has interacted with the liquid ammonia;

contacting the workpiece exposed surface in an electroplating solution including the selected metal and liquid ammonia;

causing the selected metal in the electroplating solution to deposit on the workpiece exposed surface; and when a second selected thickness of the selected metal has been deposited on the workpiece exposed surface, removing the remaining electroplating solution and rinsing the workpiece exposed surface in liquid ammonia.

16. A method for controllable deposit of a metal on a surface of an object, the method comprising:

rinsing an exposed surface of a selected workpiece in a solution in an oxygen-free solution including liquid ammonia and draining the solution;

using electroless deposition to provide a thickness of a selected metal, of a first selected thickness in a range 0.1–2 $\mu$m, on the workpiece exposed surface of a selected workpiece, where the metal is selected from a group of metals consisting of Cu, Ag, Au, Ni, Pd, Pt, Fe, Co, Zn and Cd, wherein the process of electroless deposition of the metal on the workpiece exposed surface comprises:

contacting the workpiece exposed surface in a fluid containing at least one selected copper salt or copper amine;

allowing a portion of the copper in the copper salt or copper amine to deposit on the workpiece exposed surface;

contacting said workpiece exposed surface with copper deposited thereon in liquid ammonia, and allowing the liquid ammonia to interact with at least one of a copper salt and a selected organic substance that is present; and removing the liquid ammonia and the at least one of a copper salt and a selected organic substance that has interacted with the liquid ammonia; and rinsing the workpiece exposed surface in liquid ammonia.

17. A method for controllable deposit of a metal on a surface of an object, the method comprising:

rinsing an exposed surface of a selected workpiece in a solution in an oxygen-free solution including liquid ammonia and draining the solution;

contacting the workpiece exposed surface in an electroplating solution including a selected metal and liquid ammonia, where the metal is selected from a group of metals consisting of Cu, Ag, Au, Ni, Pd, Pt, Fe, Co, Zn and Cd;

causing the selected metal in the electroplating solution to deposit on the workpiece exposed surface, wherein the process of causing the selected metal to deposit on the workpiece exposed surface comprises:

performing the electroplating deposit process at a pressure p in a selected range $0 \text{ psig} \leq p \leq 350 \text{ psig}$ and at a selected temperature T in the range $-78° \text{ C.} \leq T \leq 90° \text{ C.}$;

providing an electrically conducting plate within the electroplating solution; and providing a selected voltage difference $\Delta V$ between the workpiece exposed surface and the electrically conducting plate of at least about 0.3 volts for a time interval of selected length $\Delta t$ in a range $15 \text{ sec} \leq \Delta t \leq 300 \text{ sec}$; and when a selected thickness of the selected metal has been deposited on the workpiece exposed surface, removing the remaining electroplating solution and rinsing the workpiece exposed surface in liquid ammonia.

* * * * *